United States Patent
Thibaud et al.

(10) Patent No.: US 10,906,205 B2
(45) Date of Patent: Feb. 2, 2021

(54) SHAPING EQUIPMENT AND FACILITY FOR GAS-PHASE CHEMICAL INFILTRATION OF FIBROUS PREFORMS

(71) Applicant: SAFRAN CERAMICS, Le Haillan (FR)

(72) Inventors: Simon Thibaud, Moissy-Cramayel (FR); Adrien Delcamp, Moissy-Cramayel (FR); Sébastien Bertrand, Moissy-Cramayel (FR); Stéphane Goujard, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 16/467,299

(22) PCT Filed: Dec. 4, 2017

(86) PCT No.: PCT/FR2017/053374
§ 371 (c)(1),
(2) Date: Jun. 6, 2019

(87) PCT Pub. No.: WO2018/104640
PCT Pub. Date: Jun. 14, 2018

(65) Prior Publication Data
US 2020/0061868 A1    Feb. 27, 2020

(30) Foreign Application Priority Data

Dec. 7, 2016    (FR) .................................... 16 62040

(51) Int. Cl.
*B28B 23/02*    (2006.01)
*C04B 35/52*    (2006.01)
(Continued)

(52) U.S. Cl.
CPC .......... *B28B 23/024* (2013.01); *C04B 35/522* (2013.01); *C04B 35/565* (2013.01);
(Continued)

(58) Field of Classification Search
CPC ...... B28B 23/024; C04B 35/522; C04B 5/565
See application file for complete search history.

(56) References Cited

U.S. PATENT DOCUMENTS 5,480,678 A * 1/1996 Rudolph ................. C04B 35/83
                                                    427/248.1
2016/0251269 A1 * 9/2016 Luthra .................... B32B 5/024
                                                    428/212

FOREIGN PATENT DOCUMENTS

EP    0 846 787 A1    6/1998
EP    1 028 926 A2    8/2000
(Continued)

OTHER PUBLICATIONS

International Preliminary Report on Patentability and the Written Opinion of the International Searching Authority as issued in International Patent Application No. PCT/FR2017/053374, dated Jun. 11, 2019.
(Continued)

*Primary Examiner* — Jacob T Minskey
*Assistant Examiner* — Melody Tsui
(74) *Attorney, Agent, or Firm* — Pillsbury Winthrop Shaw Pittman LLP

(57)    ABSTRACT

A shaping tooling for chemical vapor infiltration of a fiber preform includes a structural enclosure formed by supports each provided with a multiply-perforated zone. Each of the supports has in its inside face an uncased zone that includes the multiply-perforated zone. The shaping tooling further includes first and second shaping mold functional elements, each present in a respective one of the uncased zones of the
(Continued)

support. Each shaping mold functional element has a first face of a determined shape corresponding to the shape of the part that is to be made and a second face that is held facing the inside face of a support. Each functional element has a plurality of perforations and presents a number of perforations, a size of perforations, or a shape of perforations that differs from the number, the size, or the shape of the perforations present in the facing support.

9 Claims, 6 Drawing Sheets

(51) Int. Cl.
| | |
|---|---|
| *C04B 35/565* | (2006.01) |
| *C04B 35/583* | (2006.01) |
| *C04B 35/80* | (2006.01) |
| *C04B 35/83* | (2006.01) |
| *C23C 16/453* | (2006.01) |

(52) U.S. Cl.
CPC .......... *C04B 35/583* (2013.01); *C04B 35/806* (2013.01); *C04B 35/83* (2013.01); *C23C 16/453* (2013.01); *C04B 2235/5244* (2013.01); *C04B 2235/5248* (2013.01); *C04B 2235/614* (2013.01)

(56) References Cited

FOREIGN PATENT DOCUMENTS

| | | | |
|---|---|---|---|
| EP | 1 452 624 A2 | 9/2004 | |
| EP | 1 815 975 A1 | 8/2007 | |
| EP | 1452624 B1 * | 6/2008 | ........... C23C 16/545 |
| WO | WO 99/21805 A2 | 5/1999 | |

OTHER PUBLICATIONS

International Search Report as issued in International Patent Application No. PCT/FR2017/053374, dated Feb. 28, 2018.

* cited by examiner

SHAPING EQUIPMENT AND FACILITY FOR GAS-PHASE CHEMICAL INFILTRATION OF FIBROUS PREFORMS

CROSS-REFERENCE TO RELATED APPLICATIONS

This application is the U.S. National Stage of PCT/FR2017/053374, filed Dec. 4, 2017, which in turn claims priority to French patent application number 1662040 filed Dec. 7, 2016. The content of these applications are incorporated herein by reference in their entireties.

BACKGROUND OF THE INVENTION

The present invention relates to making parts out of composite material, and more particularly to the shaping tooling used during consolidation and/or densification by chemical vapor infiltration of a fiber preform that is to form the reinforcement of the composite material part.

A field of application of the invention is that of making parts out of thermostructural composite material, i.e. out of composite material presenting both mechanical properties that make it suitable for constituting structural parts, and also the ability to retain those properties up to high temperatures. Typical examples of thermostructural composite materials are carbon/carbon (C/C) composites having a reinforcing texture made of carbon fibers densified by a matrix of pyrolytic carbon, and ceramic matrix composites (CMC) having a reinforcing texture made of refractory fibers (carbon or ceramic) that is densified by a ceramic matrix.

A well-known method for consolidating or densifying fiber preforms in order to make C/C or CMC composite parts is chemical vapor infiltration (CVI). The fiber preforms for consolidating or densifying are placed in multiply-perforated shaping tooling that is itself placed in a reactor or oven where it is heated. A reagent gas containing one or more gaseous precursors of the material constituting the matrix is introduced into the reactor. The temperature and the pressure in the reactor are adjusted to enable the reagent gas to diffuse within the pores of the preforms via the perforations in the shaper and form therein a deposit of the material constituting the matrix by decomposition one or more components of the reagent gas or by reaction between a plurality of components, these components forming the precursor of the matrix. An interphase material may also be deposited with the matrix by that method.

Nevertheless, that consolidation and/or densification technique can under certain circumstances lead to matrix deposition gradients appearing in the thickness direction of the fiber preform and to local extra thicknesses or "blisters" appearing at the surface of the preform. Specifically, between the surface and the core of the preform, the thickness or the quantity of matrix that is deposited may vary by a factor of 5. These drawbacks are due mainly to a mismatch between the characteristics of the fiber preform (thickness of the preform, nature of the fibers, weave, etc.), and the structural characteristics of the shaper (number of perforations, size and shape of the perforations, etc.).

OBJECT AND SUMMARY OF THE INVENTION

Consequently, an object of the invention is to provide a solution for shaping tooling in which the structural characteristics can be defined as a function of the fiber preform that is to be consolidated and/or densified.

This object is achieved with shaping tooling for chemical vapor infiltration of a fiber preform, the tooling comprising a structural enclosure formed by at least a first support having a first multiply-perforated zone surrounded by a first contact plane and a second support having a second multiply-perforated zone surrounded by a second contact plane, the first and second supports being held one against the other via the first and second contact zones, the tooling being characterized in that the first support includes on its inside face a first uncased zone including the first multiply-perforated zone, in that the second support includes in its inside face a second uncased zone including the second multiply-perforated zone, and in that the shaping tooling further comprises at least first and second shaping mold functional elements present respectively in the first and second uncased zones of the first and second supports, each shaping mold functional element having a first face of a determined shape corresponding to a shape of the part that is to be made, and a second face held facing the inside face of a support, each shaping mold functional element having a plurality of perforations and presenting at least a number of perforations, a size of perforations, or a shape of perforations that differs from the number, the size, or the shape of the perforations present in the facing support.

Thus, the shaping tooling of the invention has removable shaping mold functional elements in which the size, the number, and/or the shape of the perforations can be defined as a function of the characteristics of the fiber preform that is to be consolidated or densified so as to cause a matrix and/or an interphase to be deposited within the preform in question in a manner that is more uniform. It is thus possible to fabricate composite material parts having improved mechanical properties.

The shaping tooling of the invention can be adapted very flexibly while limiting the cost of such adaptation. Specifically, when adapting the shaping tooling to a particular fiber preform, it is only the shaping mold functional elements that need to be changed, while conserving the main portion of the tooling, namely the supports forming the structural enclosure.

According to a first characteristic of the shaping tooling of the invention, a porous depletion layer is interposed between the inside face of each support of the structural enclosure and the second face of the shaping mold functional element held facing the inside face of the support.

By consuming a fraction of the precursor gas of the gas phase within the depletion layer before the gas phase reaches the fiber preform, the quantity of matrix that is deposited on the surface of the fiber preform is reduced, thereby avoiding the pores at the surface of the preform becoming plugged quickly and preserving for longer an array of pores that enable the gas phase to flow to the core of the preform. A matrix deposit is thus obtained that is more uniform across the thickness of the preform, with deposition gradients within the preform being limited.

The porous depletion layer may in particular be selected from one of the following textures: a carbon mat, a two-dimensional carbon fabric, a carbon felt.

According to a second characteristic of the shaping tooling of the invention, the supports and the shaping mold elements are made of a material selected from at least one of the following materials: graphite, carbon/carbon (C/C) composite material, and ceramic matrix composite material (CMC).

The invention also provides a charge for placing in an installation for densification by chemical vapor infiltration, said charge comprising a fiber preform held in shaping tooling of the invention.

As mentioned above, such a charge made with shaping tooling of the invention serves not only to consolidate or densify a preform with a matrix or interphase deposit that is more uniform, but also to avoid the formation of local extra thicknesses or "blisters" at the surface of the preform.

According to a particular aspect of the charge of the invention, the fiber preform is a preform for an aeroengine part.

The invention also provides an assembly comprising firstly an installation for densification of a fiber preform by chemical vapor infiltration, the installation comprising a reaction chamber, a reagent gas feed pipe situated at a first end of the chamber and leading into a preheating zone, and a discharge pipe situated in the vicinity of a second end, and secondly at least one charge of the invention situated in the chamber of the installation.

The invention also provides a method of fabricating a composite material part, the method comprising:
placing a fiber preform in shaping tooling of the invention;
consolidating the fiber preform with a matrix by chemical vapor infiltration; and
densifying the consolidated preform.

BRIEF DESCRIPTION OF THE DRAWINGS

Other characteristics and advantages of the invention appear from the following description of particular embodiments of the invention, given as non-limiting examples and with reference to the accompanying drawings, in which.

DETAILED DESCRIPTION OF EMBODIMENT

The present invention applies to fabricating parts out of composite material, and in particular out of thermostructural composite material. More particularly, the invention finds an advantageous application during the steps of consolidating and/or densifying fiber preforms by chemical vapor infiltration.

Figure 1:
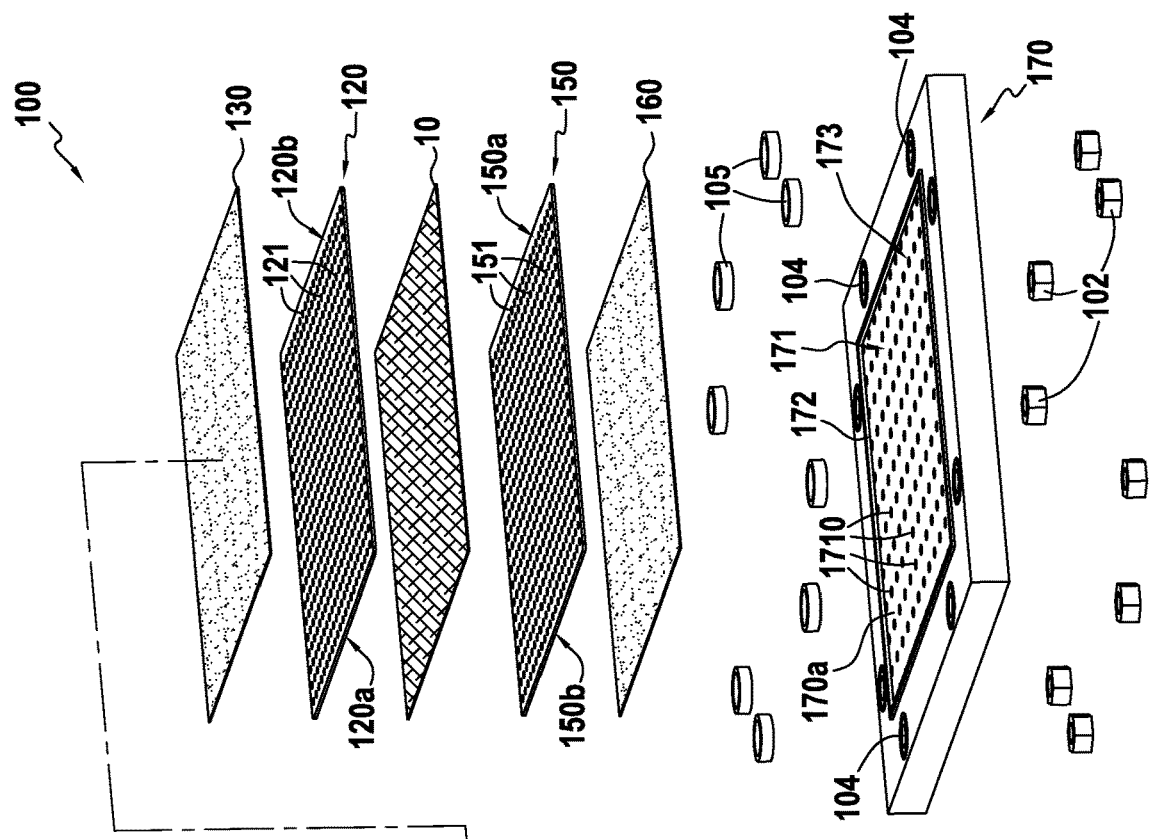
FIG. 1 is an exploded diagrammatic view showing how shaping tooling is assembled and charged with a fiber preform in an embodiment of the invention.
Figure 1:
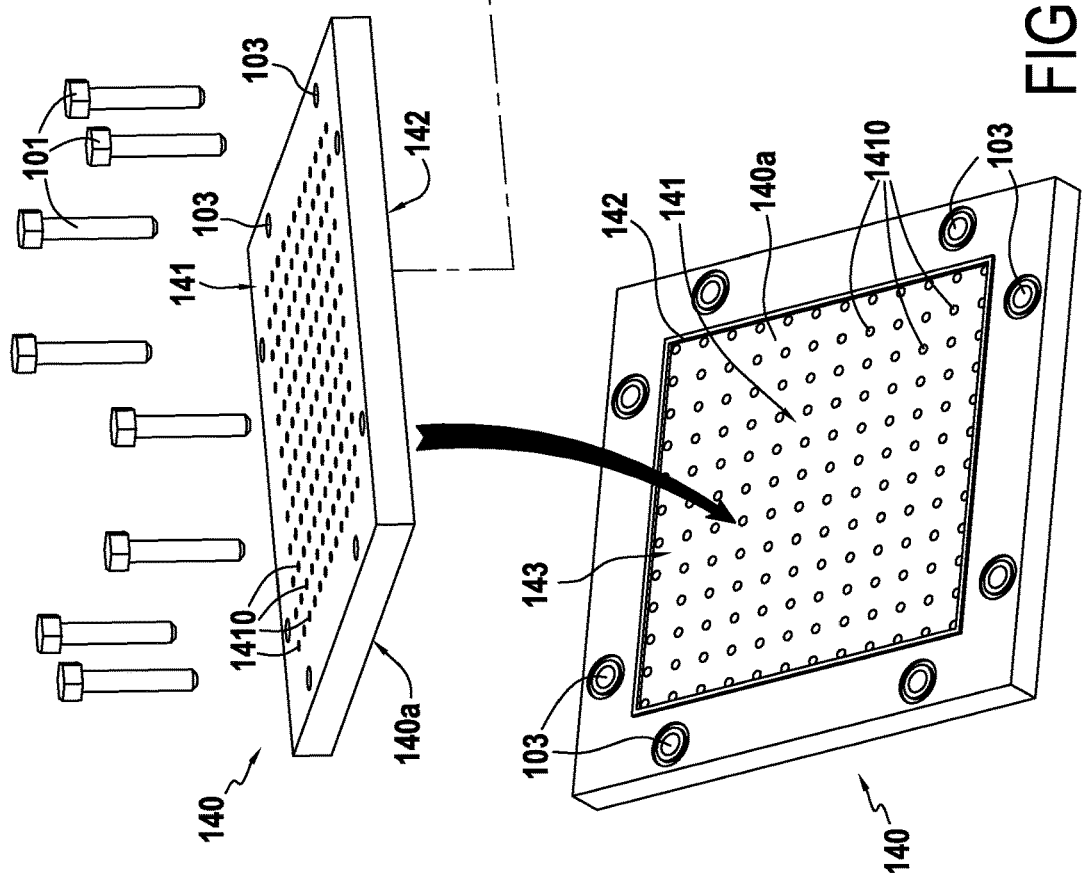
Figure 2:
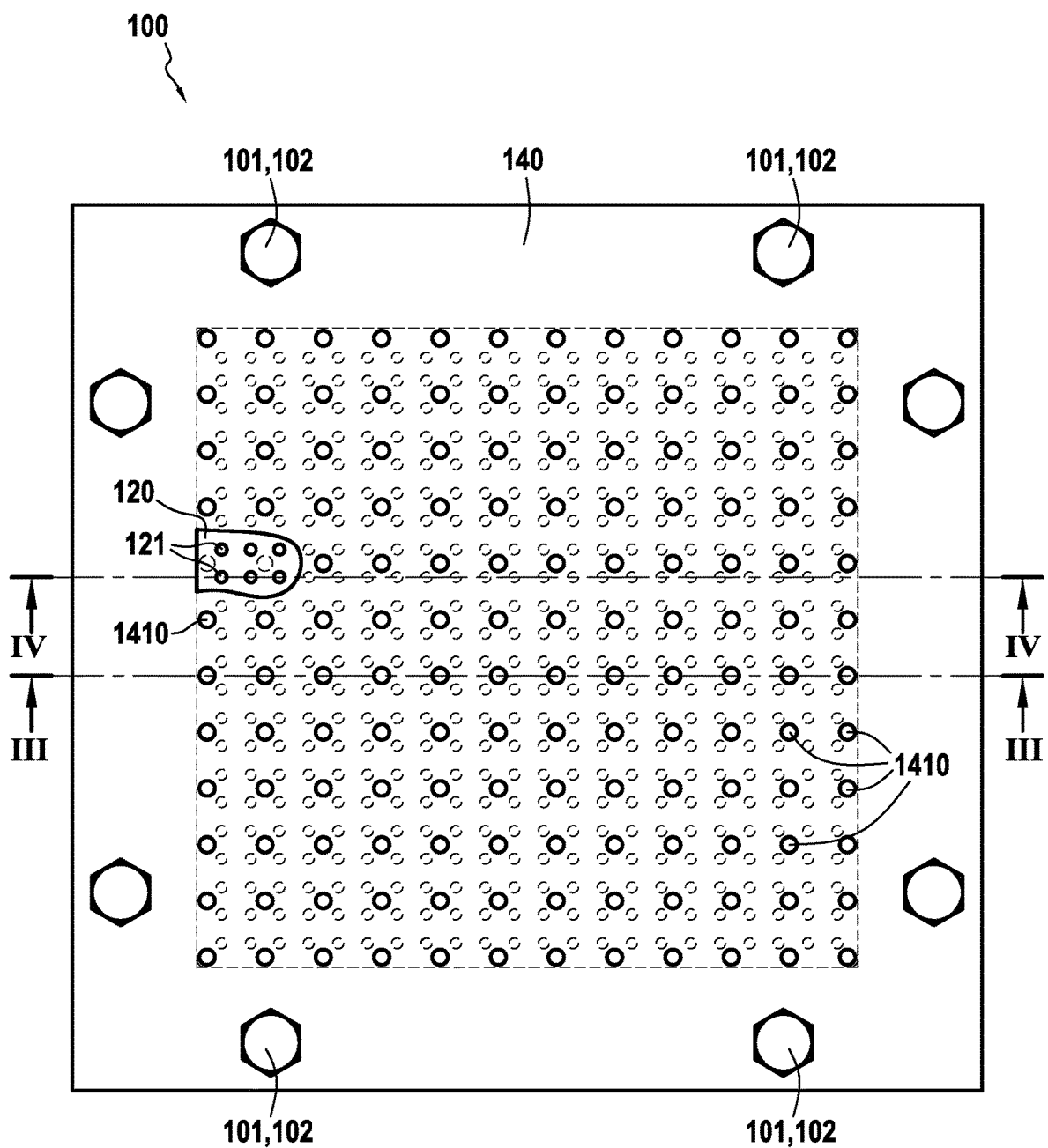
FIG. 2 is a view of the FIG. 1 tooling seen from above once it has been assembled.

FIG. 1 shows the preparation of a charge comprising installing a fiber preform 10 in shaping tooling 100 in accordance with an embodiment of the invention. Once prepared, the charge is for inserting into a reaction chamber of an industrial chemical vapor infiltration installation. In the presently-described example, the tooling 100 is for receiving fiber preforms in the form of plates that are intended in particular for characterizing composite materials. The shaping tooling of the invention may be used for receiving and shaping fiber preforms for the purpose of making parts of varied shape, such as for example blades or movable nozzle flaps for aeroengines.

The fiber preform 10 corresponds to a fiber texture that is "dry", i.e. not impregnated with resin or the like. The fiber texture may be made of fibers of various kinds, in particular of ceramic fibers (e.g. silicon carbide fibers) or of carbon fibers. The fiber texture used may be of various kinds and shapes, such as in particular:
two-dimensional (2D) fabric;
three-dimensional (3D) fabric obtained by 3D weaving or multilayer weaving, as described in particular in Document WO 2010/061140, the content of which is incorporated herein by reference;
a braid;
a knit;
a felt; and
a unidirectional (UD) sheet of yarns or tows, or multidirectional (nD) sheets obtained by superposing a plurality of UD sheets in different directions and bonding the UD sheets to one another, e.g. by stitching, by a chemical bonding agent, or by needling.

It is also possible to use a fiber texture made up of a plurality of superposed layers of fabric, braid, knit, felt, sheets, tows, etc., which layers are bonded together, e.g. by stitching, by implanting yarns or rigid elements, or by needling.

The shaping tooling 100 comprises a structural enclosure formed in this example by a first support 140 and a second support 170. The first support 140 has a first multiply-perforated zone 141 having a plurality of perforations 1410 passing through the thickness of the first support, the multiply-perforated zone 141 being surrounded by a rim 142.

The second support 170 comprises a second multiply-perforated zone 171 having a plurality of perforations 1710 passing through the thickness of the second support, the multiply-perforated zone 171 being surrounded by a rim 172.

Figure 3:
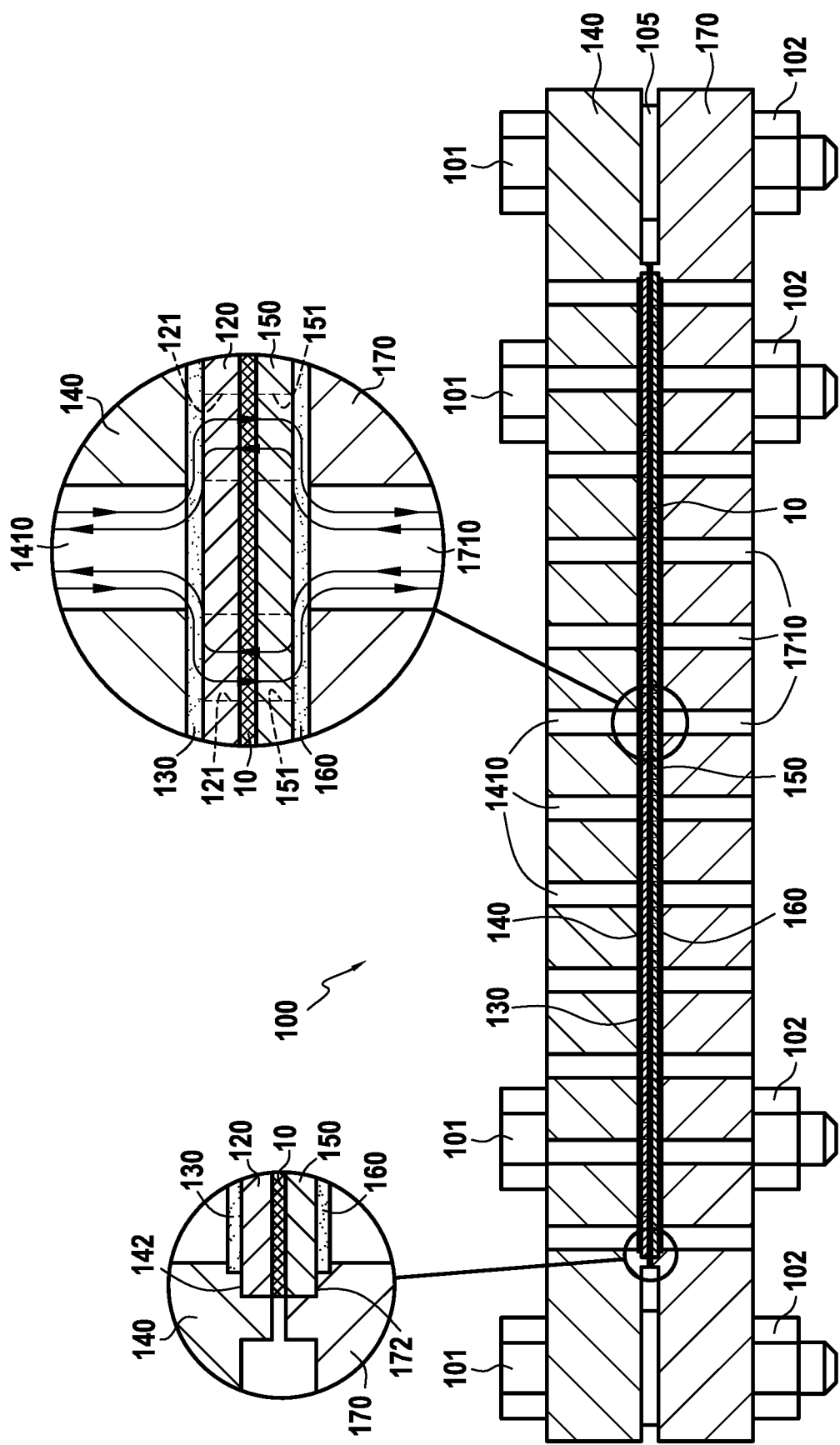
FIG. 3 is a view of the FIG. 2 tooling in section on reference III.
Figure 4:
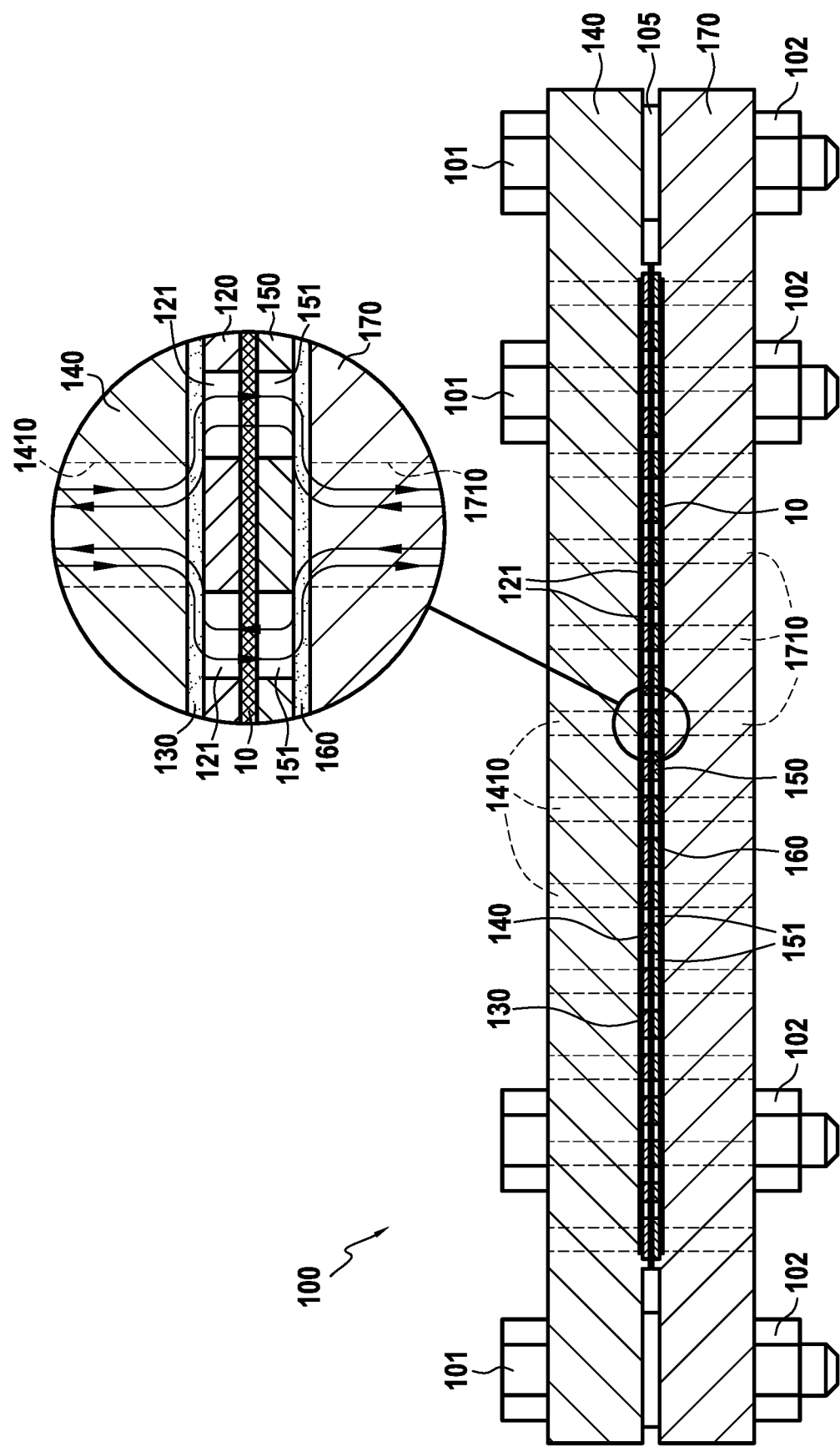
FIG. 4 is view of the FIG. 2 tooling in section on reference IV.

In accordance with the invention, the shaping tooling 100 also has a first shaping mold functional element 120 and a second shaping mold functional element 150. The first shaping mold functional element 120 is for receiving in a first uncased zone 143 present in the inside face 140a of the first support 140 and including the first multiply-perforated zone 141, the first shaping mold functional element 120 resting on the rim 142 that enables this element to be held apart from the inside face 140a of the first support 140 (FIGS. 3 and 4). The second shaping mold functional element 150 is for receiving in a second uncased zone 173 present on the inside face 170a of the second support 170 and including the second multiply-perforated zone 171, the second shaping mold functional element 150 resting on the rim 172 that serves to hold this element apart from the inside face 170a of the second support 170 (FIGS. 3 and 4). The first and second shaping mold functional elements 120 and 150 have respective first faces 120a and 150a, having a determined shape corresponding to the shape of the part that is to be made, specifically a plate. The first shaping mold functional element 120 has a second face 120b that is to be held facing the inside face 140a of the first support 140 in the first uncased zone 143 by the rim 142, while the second shaping mold functional element 150 has a second face 150b that is to be held facing the inside face 170a of the second support 170 in the second uncased zone 173 by the rim 172. The first and second shaping mold functional elements 120 and 150 include respective pluralities of perforations 121 and 151.

In accordance with the invention, the number, the size, and/or the shape of the perforations 121 and 151 that are present respectively in the first and second shaping mold functional elements 120 and 150 differ from the number, the size, and/or the shape of the perforations present in the facing supports. In the presently-described example, the first shaping mold functional element 120 has a number of perforations 121 that is larger than the number of perforations 1410 present in the first support 140. Likewise, the second shaping mold functional element 150 has a number of perforations 151 that is larger than the number of perforations 1710 present in the second support 170. This makes it possible to increase the number of entry points for the gas phase into the fiber texture and to split the gas phase entering via the perforations 1410 and 1710 in the supports 140 and 170 before it comes into contact with the fiber preform. This serves to limit local extra thicknesses and to limit deposition thickness gradients within the thickness of the part for consolidating, or to limit the formation of blisters in the fiber preform.

Furthermore, in the first and second shaping mold functional elements 120 and 150, the respective perforations 121 and 151 are preferably positioned in a manner that is offset relative to the respective perforations 1410 and 1710 present in the first and second supports 140 and 170 (FIGS. 3 and 4). This also serves to limit the appearance of local extra thicknesses and to limit deposition thickness gradients within the thickness of the part to be consolidated or to limit the formation of blisters in the fiber preform.

Figure 5:
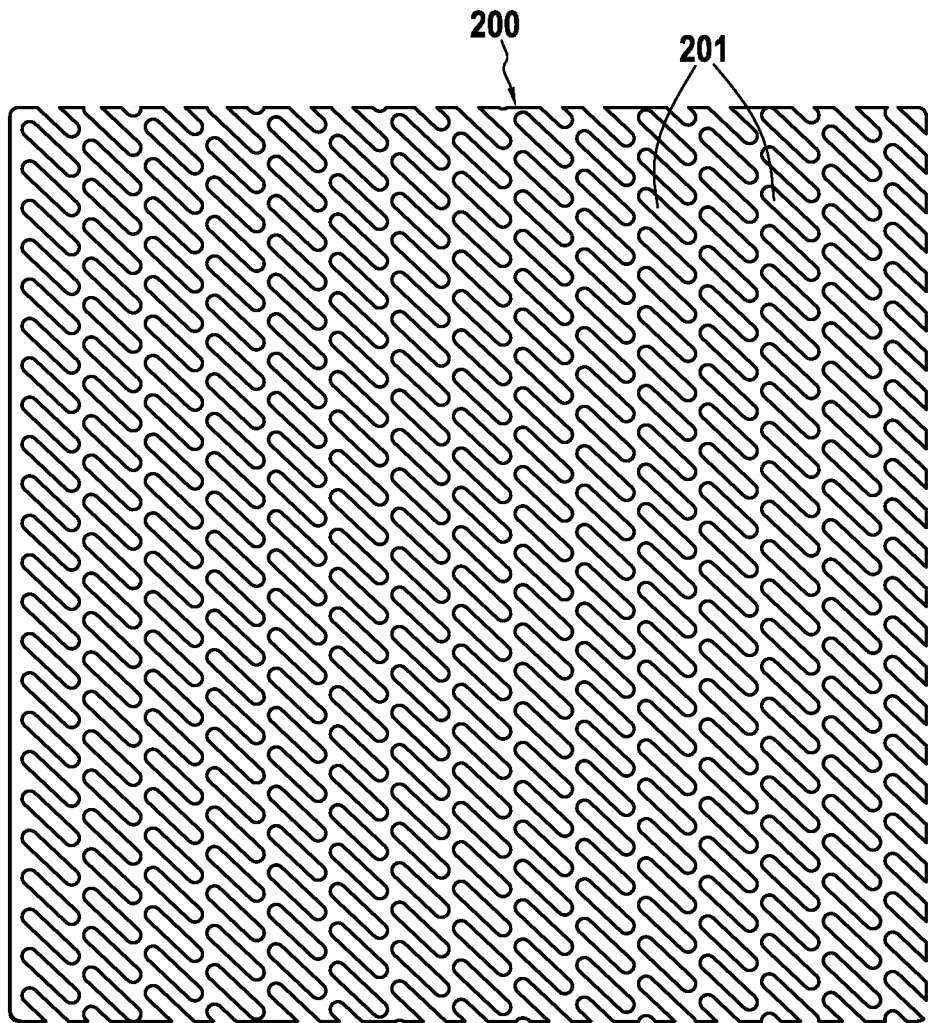
FIG. 5 shows a variant embodiment of an element of the shaper module.

FIG. 5 shows a variant embodiment of a shaping mold functional element 200 having a plurality of perforations 201 that are oblong in shape. Other perforation shapes could be envisaged as a function of parameters associated with the fiber preform that is to be densified. With the shaping mold 200, there is an increase in the total surface area of the perforations through which the fiber preform is exposed to the precursor gas entering into the tooling via the supports of the structural enclosure. Under such circumstances, this also limits the appearance of local extra thicknesses or blisters in the fiber preform.

In a particular aspect of the invention, a porous depletion layer may be interposed between a support of the structural enclosure and a shaping mold functional element. In the presently-described example, a first porous depletion layer 130 is interposed between the inside face 140a of the first support 140 and the second face 140b of the first shaping mold functional element 120 that is held spaced apart from the inside face 140a by the rim 142, while a second depletion layer 160 is interposed between the inside face 170a of the second support 170 and the second face 150b of the second shaping mold functional element 150 that is held spaced apart from the inside face 170a by the rim 172. The porous depletion layers 130 and 160 serve to "pre-consume" a portion of the precursor gas in the gas phase entering via the perforations 141 and 171 in the supports 140 and 170. This serves to limit matrix deposition gradients within the fiber preform. Specifically, by consuming a fraction of the precursor gas in the gas phase before it reaches the fiber preform, the quantity of matrix deposited at the surface of the fiber preform is diminished, thereby avoiding the pores in the surface of the preform becoming plugged quickly and thus preserving for longer an array of pores enabling the gas phase to flow into the core of the preform. This serves to obtain matrix deposition that is more uniform within the thickness of the preform by limiting deposition gradients in the preform. The porous depletion layers may be made in particular out of two-dimensional fabric made of silicon carbide (SiC) fibers or out of carbon fiber felts.

The supports forming the structural enclosure and the shaping mold functional elements may be made in particular out of graphite or out of other materials suitable for withstanding the temperatures encountered during chemical vapor infiltration operations of consolidating or densifying materials such as carbon/carbon composites or ceramic matrix composites (CMC), such as for example C/SiC materials (carbon fiber reinforcement densified by a matrix of silicon carbide), or SiC/SiC materials (both reinforcement and matrix made of silicon carbide).

In the presently-described example, the fiber preform 10 is a preform obtained by three-dimensional weaving of SiC fibers of the Hi-Nicalon® Type S type.

Figure 6:
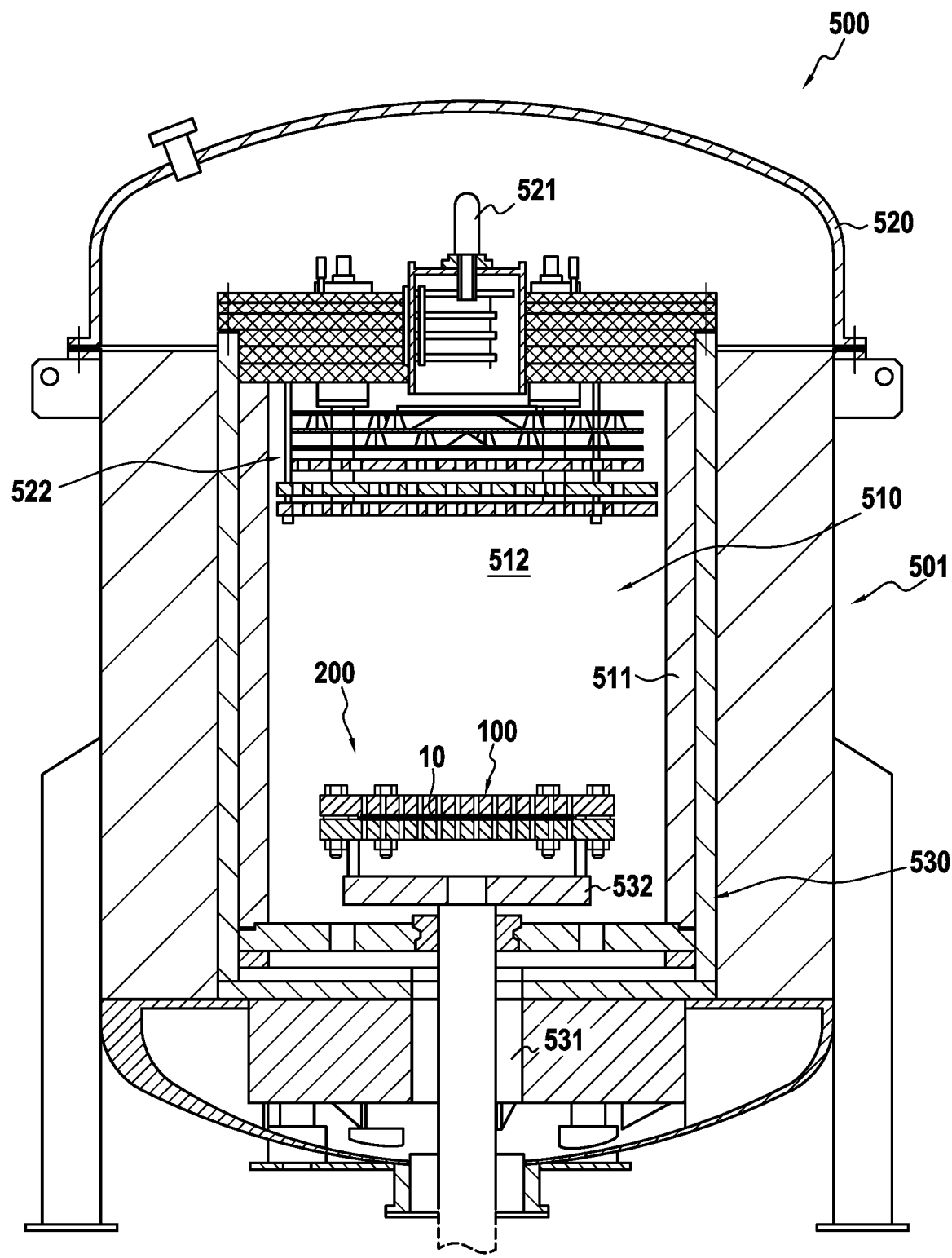
FIG. 6 is a diagrammatic perspective view of an installation for densification by chemical vapor infiltration including a charge constituted by the tooling and the fiber preform of FIG. 1.

The fiber preform 10 is placed in the shaping tooling 100 (FIGS. 3 and 4) in order to be consolidated by chemical vapor infiltration. The tooling is closed by clamping members constituted in this example by screws 101 and nuts 102, with spacers 105 being used to determine the spacing between the two supports 140 and 170. The fiber preform 10 and the tooling 100 constitutes a charge 200 that is placed in a chemical vapor infiltration oven or installation 500 as shown in FIG. 6. In known manner, the chemical vapor infiltration installation 500 comprises a cylindrical enclosure 501 defining a reaction chamber 510 that is closed in its top portion by a removable cover 520 having a gas admission pipe 521 that leads out into a preheating zone 522 serving to heat the gas before it diffuses in the reaction chamber 510 containing the preform(s) for densifying. Residual gas is extracted from the bottom 530 of the installation via a discharge pipe 531 that is connected to suction means (not shown). The bottom 530 includes a support 532 on which the charge 200 is to be placed.

Heating in the preheating zone and also inside the reaction chamber 510 is produced by a graphite susceptor 511 that is electromagnetically coupled with an induction coil (not shown). The space present in the reaction chamber 510 between the preheating zone 522 and the support 532 corresponds to the useful charging volume 512 of the infiltration installation 500, i.e. to the volume available for charging fiber preforms that are to be densified.

The preform 10 is consolidated by chemical vapor infiltration. In order to consolidate the preform, a reagent gas containing at least one or more precursors for the material of the matrix that is to be deposited is inserted into the reaction chamber 510. For a ceramic material, in this example such as silicon carbide (SiC), it is possible, in well-known manner, to use methyltrichlorosilane (MTS) as a precursor for SiC. With carbon, for example, it is possible to use gaseous hydrocarbon compounds, typically propane, methane, or a mixture of both. In well-known manner, the porous preform is consolidated by depositing matrix material within it, which matrix material is produced by decomposition of the precursor(s) contained in the reagent gas diffusing inside the pores of the accessible internal pores of the preform. The pressure and temperature conditions needed for obtaining various matrix deposits by chemical vapor infiltration are themselves well known. A pressure gradient is established between the feed pipe 521 and the discharge pipe 531 in order to encourage the reagent gas to flow through the preform.

Tests have been performed on the consolidation of a fiber preform using shaping tooling of the invention of the same type as the tooling 100 described above. More precisely, for those tests, the following elements were used:

a preform obtained by three-dimensional weaving of Hi-Nicalon® Type S SiC fibers, the preform being present in the shape of a plate;

first and second shaping tooling supports presenting in their multiply-perforated zones perforations having a diameter of 10 millimeters (mm) (Ø10 mm), these perforations being spaced apart from one another at a center-to-center pitch of 20 mm;

first and second shaping mold functional elements having perforations with a diameter of 5 mm (Ø 5 mm) and spaced apart from one another with a center-to-center pitch of 8 mm; and a porous depletion layer interposed between each support of the shaping tooling and each shaping mold element, each layer being made from a felt constituted by a tangle of graphite fibers sold by the supplier Carbone Lorraine, under the reference RVG 2000.

The preform was consolidated by chemical vapor infiltration using a BN and SiC phase.

Those tests have shown a reduction in the deposition thickness gradient within the thickness of the part by a factor of 5 compared with prior art shaping tooling. Furthermore, the deposition thickness gradients at the surface of the part, between a zone that is directly exposed to the gas (zone of the preform facing a perforation in a shaping mold functional element) and a masked zone (zone of the preform situated between two perforations in a shaping mold functional element) were reduced by a factor of 5 to 8 compared with prior art shaping tooling.

The invention claimed is:

1. Shaping tooling for chemical infiltration of a fiber preform, the tooling comprising a structural enclosure formed by at least a first support having a first multiply-perforated zone and a second support having a second multiply-perforated zone, the first and second supports being held one against the other, wherein the first support includes on its inside face a first uncased zone including the first multiply-perforated zone, wherein the first multiply-perforated zone includes first perforations that extend entirely through the first support from an outside face of the first support to the inside face of the first support, wherein the second support includes in its inside face a second uncased zone including the second multiply perforated zone, wherein the second multiply-perforated zone includes second perforations that extend entirely through the second support from an outside face of the second support to the inside face of the second support, and wherein the shaping tooling further comprises at least first and second shaping mold functional elements present respectively in the first and second uncased zones of the first and second supports, each shaping mold functional element having a first face of a determined shape corresponding to a shape of the part that is to be made, and a second face held facing the inside face of one of the first and second supports, each shaping mold functional element having a plurality of perforations and presenting at least a number of perforations, a size of perforations, or a shape of perforations that differs from the number, the size, or the shape of the perforations present in said one of the first and second supports, wherein the first multiply-perforated zone of the first uncased zone is surrounded by a first rim on which said first shaping mold rests such that said first multiply-perforated zone is spaced apart from the second face of said first shaping mold.

2. The tooling according to claim 1, wherein a porous depletion layer is interposed between the inside face of each support of the structural enclosure and the second face of the shaping mold functional element held facing the inside face of said one of the first and second supports.

3. The tooling according to claim 2, wherein the porous depletion layer is selected from one of the following textures: a carbon mat, a two-dimensional carbon fabric, a carbon felt.

4. The tooling according to claim 1, wherein the first and second supports and the first and second shaping mold functional elements are made of a material selected from at least one of the following materials: graphite, carbon/carbon composite material, and ceramic matrix composite material.

5. A charge for placing in an installation for densification by chemical vapor infiltration, said charge comprising a fiber preform held in shaping tooling according to claim 1.

6. The charge according to claim 5, wherein the fiber preform is a preform for an aeroengine part.

7. An assembly comprising an installation for densification of a fiber preform by chemical vapor infiltration, the assembly comprising a reaction chamber, a reagent gas feed pipe situated at a first end of the chamber and leading into a preheating zone, and a discharge pipe situated in the vicinity of a second end, the assembly also including at least one charge according to claim 5 situated in the chamber.

8. A method of fabricating a composite material part, the method comprising:

placing a fiber preform in shaping tooling according to claim 1;

consolidating the fiber preform with a matrix by chemical vapor infiltration; and densifying the consolidated preform.

9. The tooling according to claim 1, wherein the second multiply-perforated zone of the second uncased zone is surrounded by a second rim on which said second shaping mold rests such that said second multiply-perforated zone is spaced apart from the second face of said second shaping mold.

* * * * *